US009677177B2

(12) United States Patent
Tiner et al.

(10) Patent No.: US 9,677,177 B2
(45) Date of Patent: Jun. 13, 2017

(54) SUBSTRATE SUPPORT WITH QUADRANTS

(71) Applicant: Applied Materials, Inc., Santa Clara, CA (US)

(72) Inventors: Robin L. Tiner, Santa Cruz, CA (US); Soo Young Choi, Fremont, CA (US); Beom Soo Park, San Jose, CA (US); Shinichi Kurita, San Jose, CA (US); Bora Oh, Fremont, CA (US); Gaku Furuta, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 309 days.

(21) Appl. No.: 14/505,355

(22) Filed: Oct. 2, 2014

(65) Prior Publication Data

US 2015/0114948 A1 Apr. 30, 2015

Related U.S. Application Data

(60) Provisional application No. 61/894,954, filed on Oct. 24, 2013.

(51) Int. Cl.
*H05B 3/68* (2006.01)
*C23C 16/458* (2006.01)
*H01L 21/67* (2006.01)
*H05B 3/22* (2006.01)

(52) U.S. Cl.
CPC .... *C23C 16/4586* (2013.01); *H01L 21/67103* (2013.01); *H05B 3/22* (2013.01)

(58) Field of Classification Search
CPC .......... C23C 16/4586; H01L 21/67103; H05B 3/20–3/267; H05B 3/28–3/30; H05B 3/32; H05B 3/68–3/72; H05B 3/74–3/748
USPC ........................................... 219/443.1–468.2
See application file for complete search history.

(56) References Cited

U.S. PATENT DOCUMENTS

| | | | |
|---|---|---|---|
| 5,294,778 A * | 3/1994 | Carman | H01L 21/67103 118/725 |
| 5,790,750 A | 8/1998 | Anderson | |
| 6,469,283 B1 | 10/2002 | Burkhart et al. | |
| 8,084,719 B2 * | 12/2011 | Ciancimino | A47J 37/0676 219/450.1 |
| 2004/0149718 A1 * | 8/2004 | Ito | H01L 21/67103 219/444.1 |
| 2006/0186110 A1 * | 8/2006 | Campello | H01L 21/67103 219/444.1 |
| 2007/0258186 A1 | 11/2007 | Matyushkin et al. | |
| 2010/0116788 A1 | 5/2010 | Singh et al. | |
| 2011/0092072 A1 | 4/2011 | Singh et al. | |

* cited by examiner

*Primary Examiner* — Sang Y Paik
(74) *Attorney, Agent, or Firm* — Patterson + Sheridan, LLP

(57) ABSTRACT

The present invention generally relates to a substrate support for use in a processing chamber. The substrate support is divided into quadrants with each quadrant capable of heating independent of the other quadrants. The independent heating permits the substrate support to provide different heating to either different substrate simultaneously disposed on the substrate support or to different areas of a common substrate. Thus, the substrate heating may be tailored to ensure desired processing of the substrate or substrates occurs.

19 Claims, 3 Drawing Sheets

SUBSTRATE SUPPORT WITH QUADRANTS

CROSS-REFERENCE TO OTHER APPLICATIONS

This application claims benefit of United States Provisional Patent Application Ser. No. 61/894,954 (APPM/21211L), filed Oct. 24, 2013, which is herein incorporated by reference.

BACKGROUND

Field

Embodiments of the present disclosure generally relate to a substrate support for use in a substrate processing chamber.

Description of the Related Art

Plasma enhanced chemical vapor deposition (PECVD) is generally employed to deposit thin films on substrates, such as organic light emitting diode (OLED) substrates and semiconductor substrates. PECVD is generally accomplished by introducing a precursor gas into a vacuum chamber having a substrate disposed on a substrate support. The precursor gas is typically directed through a gas distribution showerhead situated near the top of the vacuum chamber. The precursor gas in the vacuum chamber is excited into a plasma by applying an RF power to a chamber electrode from one or more RF sources coupled to the chamber. The plasma forms a layer of material on a surface of a substrate that is positioned on a substrate support. The gas distribution showerhead is generally connected to an RF power source and the substrate support is typically connected to the chamber body to create an RF power return path.

With large area substrates (i.e., substrates having a surface area of greater than about 1600 $cm^2$), maintaining uniform conditions during processing can be challenging due to the enormous area in which the conditions need to remain controlled. It is oftentimes the case that one area of the substrate will be exposed to different processing conditions when compared to another area of the substrate. Additionally, when multiple substrates are processed on the same area as the large area substrate, each substrate may be exposed to different processing conditions.

Therefore, there is a need in the art for an apparatus that operates under substantially uniform processing conditions.

SUMMARY

The present disclosure generally relates to a substrate support for use in a processing chamber. The substrate support is divided into quadrants with each quadrant capable of heating independent of the other quadrants. The independent heating permits the substrate support to provide different heating to either different substrate simultaneously disposed on the substrate support or to different areas of a common substrate. Thus, the substrate heating may be tailored to ensure desired processing of the substrate or substrates occurs.

In one embodiment, substrate support comprises a rectangular substrate support body having a first quadrant, a second quadrant, a third quadrant and a fourth quadrant; and a first heating element disposed in the first quadrant and extending from a center area of the substrate support body. The first heating element has a first segment having a first length and extending from the center area; a second segment having a second length; a third segment having a third length and extending substantially perpendicular to the second segment; and a fourth segment having a fourth length and extending substantially perpendicular to the third segment and substantially parallel to the second segment, the fourth segment extending to the center area. The substrate support also comprises a second heating element substantially surrounded by the first heating element, the second heating element having a substantially "C" shaped pattern; a first thermocouple disposed between the first heating element and the second heating element; and a second thermocouple at least partially surrounded by the "C" shaped pattern.

In another embodiment, a substrate support comprises a substrate support body having four quadrants with each quadrant having: a first heating element substantially surrounding a second heating element; a first thermocouple disposed between the first heating element and the second heating element; and a second thermocouple at least partially surrounded by the second heating element.

In another embodiment, a substrate support comprises a rectangular substrate support body having a first quadrant, a second quadrant, a third quadrant and a fourth quadrant and a first heating element disposed in the first quadrant and coupled to a first electrical connection extending from a center area of the substrate support body. The first heating element has a first segment that is substantially parallel to a first edge of the substrate support body; a first curved segment coupled to the first segment; an inversely curved corner section coupled to the first curved segment; a second curved segment coupled to the inversely curved corner section; and a second segment extending substantially parallel to a second edge of the substrate support body and perpendicular to the first segment, the second segment extending to a second electrical connection that extends from the center area. The substrate support additionally includes a second heating element substantially surrounded by the first heating element, the second heating element having a substantially "C" shaped pattern; a first thermocouple disposed between the first heating element and the second heating element; and a second thermocouple at least partially surrounded by the "C" shaped pattern.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to a substrate support for use in a processing chamber. The substrate support is divided into quadrants with each quadrant capable of heating independent of the other quadrants. The independent heating permits the substrate support to provide different heating to either different substrate simultaneously disposed on the substrate support or to different areas of a common substrate. Thus, the substrate heating may be tailored to ensure desired processing of the substrate or substrates occurs.

The description herein will be made with reference to a PECVD chamber available from AKT America, Inc., a subsidiary of Applied Materials, Inc., Santa Clara, Calif. It is to be understood that the embodiments herein are equally applicable to other processing chambers as well, including processing chambers sold by other manufacturers.

Figure 1:
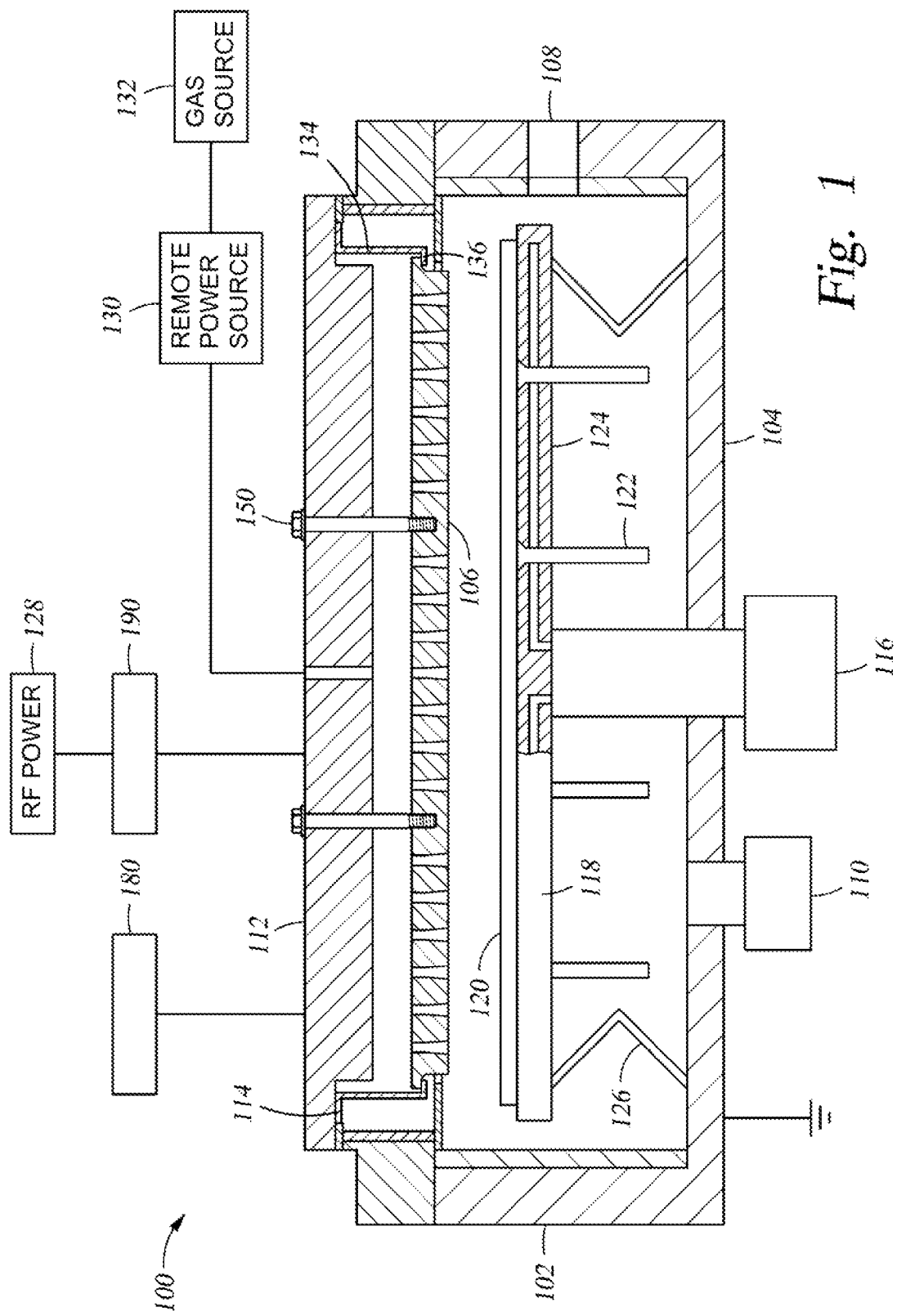
FIG. 1 is a cross sectional view of a PECVD apparatus according to one embodiment of the disclosure.

FIG. 1 is a cross sectional view of a PECVD apparatus according to one embodiment. The apparatus includes a chamber 100 in which one or more films may be deposited onto a substrate 120. The chamber 100 generally includes walls 102, a bottom 104 and a gas distribution showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 may also include RF return straps 126 to provide an RF return path at the periphery of the substrate support 118.

The gas distribution showerhead 106 is coupled to a backing plate 112 by a fastening mechanism 150. The gas distribution showerhead 106 may be coupled to the backing plate 112 by one or more fastening mechanisms 150 to help prevent sag and/or control the straightness/curvature of the gas distribution showerhead 106.

A gas source 132 is coupled to the backing plate 112 to provide gas through gas passages in the gas distribution showerhead 106 to a processing area between the gas distribution showerhead 106 and the substrate 120. A vacuum pump 110 is coupled to the chamber 100 to control the process volume at a desired pressure. An RF source 128 is coupled through a match network 190 to the backing plate 112 and/or to the gas distribution showerhead 106 to provide an RF current to the gas distribution showerhead 106. The RF current creates an electric field between the gas distribution showerhead 106 and the substrate support 118 so that a plasma may be generated from the gases between the gas distribution showerhead 106 and the substrate support 118.

A remote plasma source 130, such as an inductively coupled remote plasma source, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the gas distribution showerhead 106.

The gas distribution showerhead 106 may additionally be coupled to the backing plate 112 by showerhead suspension 134. The showerhead suspension 134 provides a thermal transfer contact between the gas distribution showerhead 106 and the backing plate 112. The showerhead suspension 134 may have a lip 136 upon which the gas distribution showerhead 106 may rest. The backing plate 112 may rest on an upper surface of a ledge 114 coupled to the chamber walls 102 to seal the chamber 100. In one embodiment, the showerhead suspension 134 is a flexible metal skirt interconnected between the backing plate 112 and the gas distribution showerhead 106.

Figure 2:
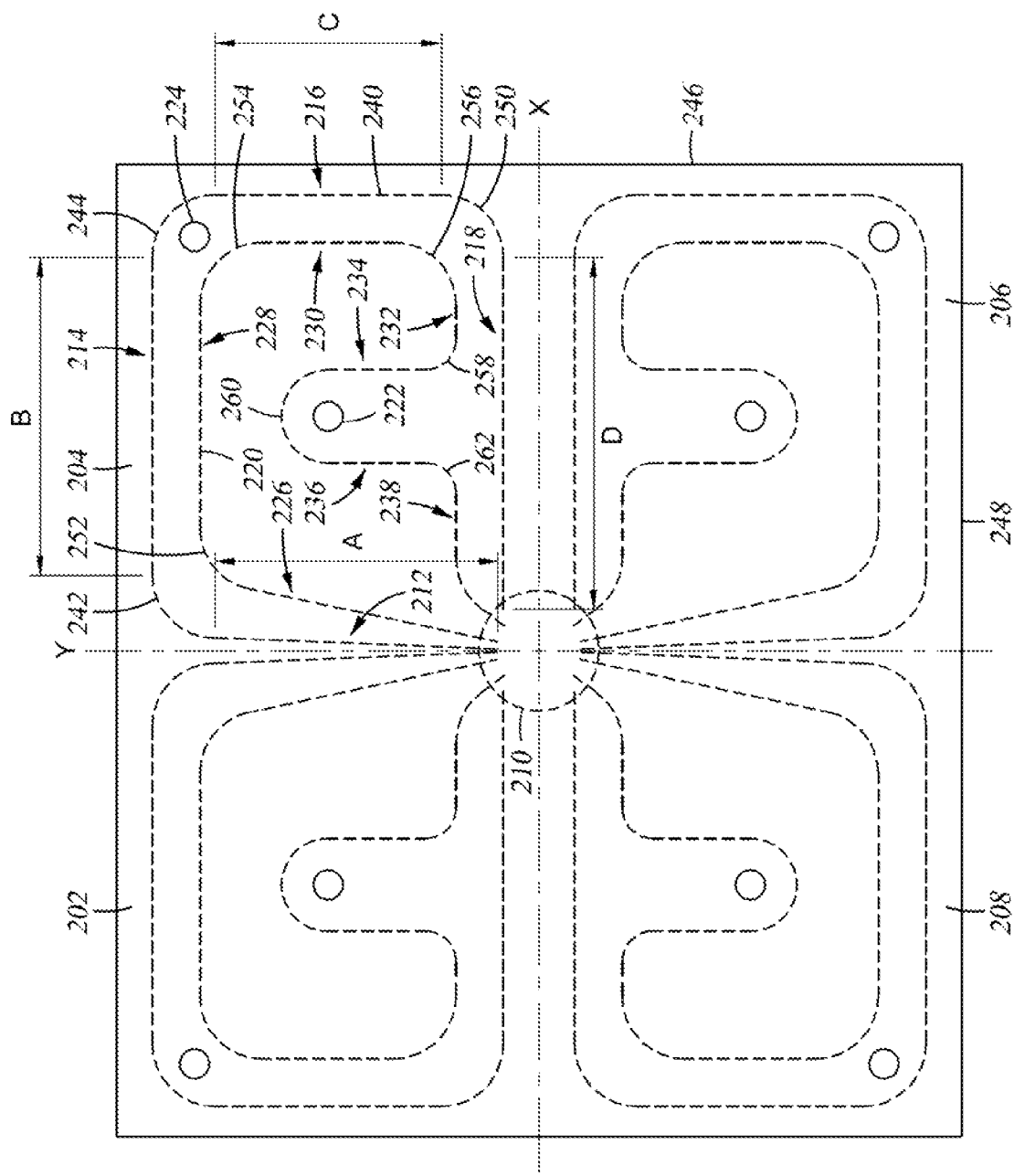
FIG. 2 is a schematic illustration of the substrate support with heating element and thermocouple element layout according to one embodiment of the disclosure.

FIG. 2 is a schematic illustration of the substrate support 118 with heating element and thermocouple element layout according to one embodiment of the disclosure. The substrate support 118 has four quadrants 202, 204, 206, 208. Within each quadrant 202, 204, 206, 208, first and second heating elements 240, 220 are present with the first heating element 240 substantially surrounding the second heating element 220. As shown in FIG. 2, the first heating element 240 has a first segment 212 that extends from the center area 210 of the substrate support. The first heating element 240 is electrically coupled through the pedestal, upon which the substrate support 118 rests, to a power source. The first segment 212 extends for a first distance "A" and is coupled to the second segment 214. The second segment 214 is coupled to the first segment 212 via a curved portion 242. The second segment 214 extends for a distance "B". A third segment 216 is coupled to the second segment 214 and is substantially perpendicular to the second segment 214. The third segment 216 has a length "C" and is coupled to the second segment 214 via a curved portion 244. As shown in FIG. 2, "B" is longer than "A" and "C" individually.

The first segment 212 and the third segment 216 are not parallel. The third segment 216 is substantially parallel to the edge 246 while the first segment 212 is at an angle relative to the edge 246. The third segment 216 is coupled to a fourth segment 218 via a curved portion 250. The fourth segment 218 is substantially perpendicular to the third segment 216, substantially parallel to the second segment 214, and substantially parallel to the edge 248 of the substrate support 118. Edge 248 is substantially perpendicular to edge 246. The four segment 218 extends for a fourth distance "D" and extends to the center area 210.

The second heating element 220 has a substantially "C" shaped pattern and is almost entirely surrounded by the first heating element 240. The second heating element 220 extends from the center area 210 with a first portion 226 that extends at an angle relative to the first segment 212 of the first heating element 240. A second portion 228 is coupled to the first portion 226 by a curved portion 252. The second portion 228 is substantially parallel to the second segment 214 of the first heating element 240. The second portion 228 is coupled to a third portion 230 via a curved portion 254. The third portion 230 is substantially parallel to the third segment 216 and substantially perpendicular to the second portion 228. A fourth portion 232 is coupled to the third portion 230 via a curved portion 256. The fourth portion 232 is substantially parallel to the fourth segment 218. A fifth portion 234 is coupled to the fourth portion 232 via a curved portion 258. The fifth portion 234 is substantially parallel to the third portion 230 and substantially perpendicular to the fourth portion 232. A sixth portion 236 is coupled to the fifth portion 234 via a curved portion 260. The sixth portion 236 is substantially parallel to the fifth portion 234. A seventh portion 238 is coupled to the sixth portion 236 via a curved portion 262. The seventh portion 238 is substantially perpendicular to the sixth portion 236. Additionally, the seventh portion 238 is substantially parallel to the fourth portion 232 and extends along a common axis with the fourth portion 232.

The second heating element 220 substantially surrounds a first thermocouple 222 whereby the thermocouple is surrounded by the curved portion 260, the fifth portion 234 and the sixth portion 236. A second thermocouple 224 is also present between the first and second heating elements 240, 220. Specifically, the second thermocouple is between curved portions 244, 254 of the first and second heating elements 240, 220.

Each quadrant 202, 204, 206, 208 has an identical heating element and thermocouple layout. The heating elements and thermocouples in quadrant 202 are arranged as a mirror image of the heating elements and thermocouples of quadrant 204 where the theoretical mirror is the "Y" axis. Similarly, the heating elements and thermocouples in quadrant 206 are arranged as a mirror image of the heating elements and thermocouples in quadrant 204 where the theoretical mirror is the "X" axis. Thus, the heating elements and thermocouples in quadrant 208 are mirror arranged as mirror images of the heating elements in quadrants 202 and 206 where the theoretical mirrors are the "X" and "Y" axis respectively. As such, quadrant 208 is a flipped, mirror image of quadrant 204.

In total, there are four different quadrants 202, 204, 206, 208. Each quadrant 202, 204, 206, 208 has two heating zones and two thermocouples for a total of eight heating zones and eight thermocouples for the substrate support 118. Because there are four quadrants that are each independently operable, individual areas of a substrate disposed thereon may be heated differently if needed to ensure uniform deposition on the substrate. Alternatively, if multiple substrates are present, each substrate may be processed at different substrate temperatures while on the same substrate support 118.

Figure 3:
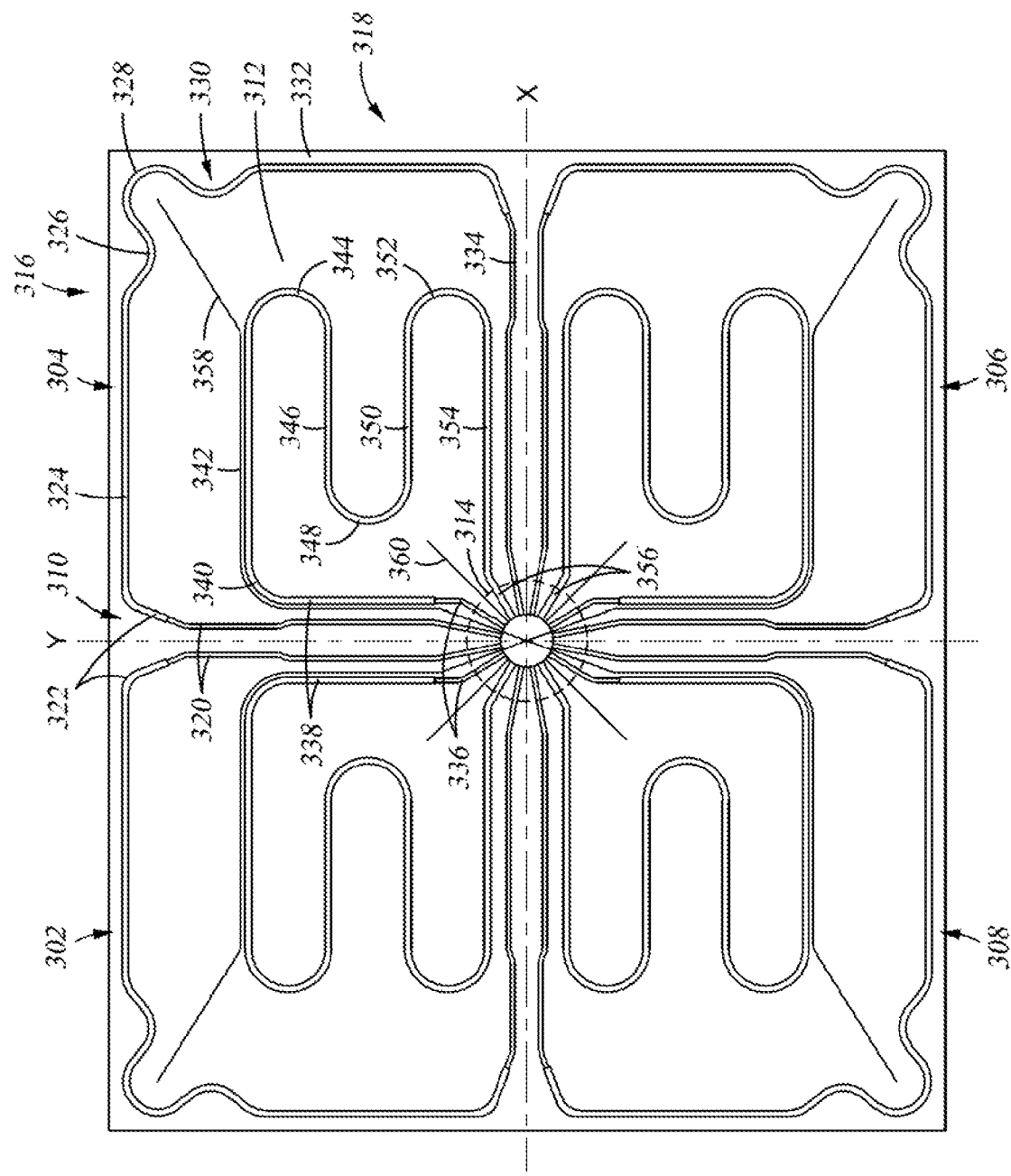
FIG. 3 is a schematic illustration of the substrate support with heating element and thermocouple element layout according to another embodiment of the disclosure.

FIG. 3 is a schematic illustration of the substrate support 118 with heating element and thermocouple element layout according to another embodiment of the disclosure. The substrate support 118 is divided into four quadrants 302, 304, 306, 308. Each quadrant 302, 304, 306, 308 have identical heating element and thermocouple layouts. Therefore, description will be made with reference to a single quadrant 302, 304, 306, 308.

The quadrants 302, 304, 306, 308 have outer heating elements 310 and inner heating elements 312. The outer heating elements do not begin at the center area 314, but rather, begin closer to the edges 316, 318 of the substrate support 118. As shown in FIG. 3, an electrical connection 320 extends from the center area 314 substantially parallel to the "Y" axis. The heating element 312 is coupled to the electrical connection 320 just before a bend 322 in the heating element. The heating element then has a segment 324 that is substantially parallel to edge 316 for a first distance. The heating element then has a curved segment 326 connected to an inversely curved corner section 328 which is connected to another curved segment 330 that is inversely curved relative to the curved corner section 328. Segment 330 is connected to a segment 332 that is substantially parallel to the edge 318 of the substrate support 118. Thereafter, the heating element 310 curves and then connects to another electrical connection 334 that extends back to the center area 314. As can be clearly seen from FIG. 3, because of the presence of the electrical connections 320, 334 rather than heating elements extending from the center area 314, two outer heating elements in adjacent quadrants 302, 304, 306, 308 are not disposed adjacent each other. Thus, the heating elements 310 do not 'double heat' a common area and therefore, the temperature throughout the quadrant 302, 304, 306, 308 can be controlled to be substantially uniform. Segments 324 and 332 are substantially perpendicular to one another.

The inner heating element 312 has a different pattern as compared to the outer heating element 310. As shown in FIG. 3, an electrical connection 336 extends from the center area 314 and connects to the heating element 312 as a location outside of the center area. The heating element 312 has a segment 338 that is substantially parallel to the edge 318. A curved corner portion 340 is connected to segment 338 as is a segment 342 that is substantially perpendicular to segment 338, yet substantially parallel to edge 316. The heating element 312 then makes a 180 degree turn around a curved portion 344 to a segment 346 that is substantially parallel to segment 342. The heating element 312 then makes another 180 degree turn around curved portion 348 to a segment 350 that is substantially parallel to segment 346. The heating element then makes another 180 degree turn at curved portion 352 that is connected to a segment 354 that is substantially parallel to segment 350. Segment 354 extends into the center area 314 where it is connected to another electrical connection 356.

A first thermocouple 358 is disposed between the inner heating element 312 and the outer heating element 310 and has a pattern that matches segment 338, curved corner portion 340 and segment 342. The first thermocouple 358, rather than matching curved portion 344, extends outward towards curved corner segment 328 of the outer heating element 310. A second thermocouple 360 extends within the area enclosed by the inner heating element 312. As shown in FIG. 3, the inner heating element 312 has a substantially "C" shaped pattern.

Each quadrant 302, 304, 306, 308 has an identical heating element and thermocouple layout. The heating elements and thermocouples in quadrant 302 are arranged as a mirror image of the heating elements and thermocouples of quadrant 304 where the theoretical mirror is the "Y" axis. Similarly, the heating elements and thermocouples in quadrant 306 are arranged as a mirror image of the heating elements and thermocouples in quadrant 304 where the theoretical mirror is the "X" axis. Thus, the heating elements and thermocouples in quadrant 308 are mirror arranged as mirror images of the heating elements in quadrants 302 and 306 where the theoretical mirrors are the "X" and "Y" axis respectively. As such, quadrant 308 is a flipped, mirror image of quadrant 304.

In total, there are four different quadrants 302, 304, 306, 308. Each quadrant 302, 304, 306, 308 has two heating zones and two thermocouples for a total of eight heating zones and eight thermocouples for the substrate support 118. Because there are four quadrants that are each independently operable, individual areas of a substrate disposed thereon may be heated differently if needed to ensure uniform deposition on the substrate. Alternatively, if multiple substrates are present, each substrate may be processed at different substrate temperatures while on the same substrate support 118.

While the foregoing is directed to embodiments of the present disclosure, other and further embodiments of the disclosure may be devised without departing from the basic scope thereof, and the scope thereof is determined by the claims that follow.

The invention claimed is:
1. A substrate support, comprising:
   a rectangular substrate support body having an outer edge, a first quadrant, a second quadrant, a third quadrant and a fourth quadrant;

a first heating element disposed in the first quadrant and extending from a center area of the substrate support body, the first heating element having:
   a first segment having a first length and extending from the center area;
   a second segment having a second length, the second segment coupled to the first segment and extending therefrom along a first portion of the outer edge of the rectangular substrate support;
   a third segment having a third length and extending along a second portion of the outer edge substantially perpendicular to the first portion, the third segment coupled to the second segment; and
   a fourth segment having a fourth length and extending from the third segment and substantially parallel to the second segment, the fourth segment coupled to the third segment and extending to the center area;
a second heating element substantially surrounded by the first heating element, the second heating element having a substantially "C" shaped pattern;
a first thermocouple disposed between the first heating element and the second heating element; and
a second thermocouple at least partially surrounded by the "C" shaped pattern.

2. The substrate support of claim 1, wherein the second heating element has:
   a first portion extending from the center area;
   a second portion coupled to the first portion;
   a third portion coupled to the second portion;
   a fourth portion coupled to the third portion;
   a fifth portion coupled to the fourth portion;
   a sixth portion coupled to the fifth portion; and
   a seventh portion coupled to the sixth portion and extending to the center area.

3. The substrate support of claim 2, wherein the second portion is substantially parallel to the second segment.

4. The substrate support of claim 3, wherein the second portion is coupled to the first portion via a curved portion.

5. The substrate support of claim 4, wherein the third portion is substantially parallel to the third segment.

6. The substrate support of claim 5, wherein the fourth portion and the seventh portion are substantially parallel.

7. The substrate support of claim 6, wherein the fourth portion and the seventh portion are aligned along a common axis.

8. The substrate support of claim 7, wherein the fifth portion and the sixth portion are substantially parallel.

9. The substrate support of claim 8, wherein the fifth portion and the sixth portion are substantially perpendicular to the fourth portion and the seventh portion.

10. The substrate support of claim 9, wherein the second thermocouple is disposed between the sixth portion, the fifth portion and a curved portion that couples the fifth portion to the sixth portion.

11. The substrate support of claim 10, wherein the first thermocouple is disposed between a curved portion that couples the second segment to the third segment, and a curved portion that couples the second portion to the third portion.

12. The substrate support of claim 11, wherein the second quadrant is a mirror image of the first quadrant.

13. The substrate support of claim 12, wherein the third quadrant is a mirror image of the first quadrant.

14. The substrate support of claim 13, wherein the fourth quadrant is a mirror image of both the second quadrant and the third quadrant.

15. The substrate support of claim 1, wherein the second quadrant is a mirror image of the first quadrant.

16. The substrate support of claim 15, wherein the third quadrant is a mirror image of the first quadrant.

17. The substrate support of claim 16, wherein the fourth quadrant is a mirror image of both the second quadrant and the third quadrant.

18. The substrate support of claim 1, wherein the third quadrant is a mirror image of the first quadrant.

19. The substrate support of claim 1, wherein the fourth quadrant is a mirror image of both the second quadrant and the third quadrant.

* * * * *